United States Patent [19]

Huang et al.

[11] Patent Number: 6,034,543
[45] Date of Patent: Mar. 7, 2000

[54] PROGRAMMABLE LOGIC ARRAY STRUCTURE HAVING REDUCED PARASITIC LOADING

[75] Inventors: Jian-hui Huang; Ralph Portillo, both of Mountain View; Fredrick R. Gruner, Palo Alto, all of Calif.

[73] Assignee: Intel Corporation, Santa Clara, Calif.

[21] Appl. No.: 08/969,009

[22] Filed: Nov. 12, 1997

[51] Int. Cl.[7] ........................................ G06F 7/38

[52] U.S. Cl. .................. 326/39; 326/44; 326/49

[58] Field of Search ................... 326/44, 45, 39, 326/49, 50, 17

[56] References Cited

U.S. PATENT DOCUMENTS

| | | | |
|---|---|---|---|
| 5,235,221 | 8/1993 | Douglas et al. | 307/465 |
| 5,712,578 | 1/1998 | Conley | 326/39 |
| 5,872,462 | 2/1999 | Ditlow et al. | 326/39 |

*Primary Examiner*—Michael Tokar
*Assistant Examiner*—Antt Q. Tran
*Attorney, Agent, or Firm*—Raymond J. Werner

[57] ABSTRACT

The present invention provides a PLA structure having logic interposed between an AND plane and an OR plane, wherein the interposed logic provides an additional set of minterms to the OR plane such that any PLA output function can be implemented with substantially fewer input signals. In this way, parasitic loading for implementation of any particular logic function is reduced.

17 Claims, 3 Drawing Sheets

PROGRAMMABLE LOGIC ARRAY STRUCTURE HAVING REDUCED PARASITIC LOADING

BACKGROUND ON THE INVENTION

1. Field of the Invention

The invention relates to programmable logic array (PLA) structures generally, and more particularly to high speed structures for PLAs having a large number of inputs and/or minterms.

2. Background

PLAs are combinational two-level AND-OR structures that can be programmed to realize any sum-of-product logic expression. PLAs are widely used in integrated circuits. Complex integrated circuits such as processors and microprocessors often use several large PLAs.

FIG. 1(a) shows a transistor-level schematic of a basic conventional static PLA. A PLA 100 typically has one AND plane 102 and one OR plane 104. AND plane 102 receives input signals 106, performs a logical function on the input signals and generates a number of minterms 108 (i.e., AND plane output signals) that are provided as input signals to an OR plane 104 of PLA 100. OR plane 104 performs a logical function and produces the final logical outputs of PLA 100. The actual number of input signals, minterm signals, and PLA output signals are determined by the overall logical function that PLA 100 is to implement. It can be seen in the example of FIG. 1(a) that the parasitic capacitive loading of OR plane output lines 110 due to the drain junctions of n-channel transistor pull-downs 112 varies according to the number of pull-downs 112. In this example, output line 110a has only one pull-down, output line 110b has two pull-downs and output line 110c is fully programmed with pull-downs and therefore is the most heavily loaded with parasitic junction capacitance.

The logical structure of a typical PLA 150 is shown in FIG. 1(b). Referring to the circuit implementation shown in FIG. 1(b), it can be seen that Buffer_1 152 is coupled between the input signal sources, and the input terminals of an AND plane 154. Buffer_1 152 provides the input signals with the signal strength required to drive AND plane 154. Buffer_2 156 is coupled between AND plane 154 and an OR plane 158, so as to receive the minterm signals and provide the signal strength required to drive OR plane 158. Although neither Buffer_1 152 or Buffer_2 156 perform logical functions, they do increase the delay from the time an input signal is asserted to when the PLA output signals become valid.

While PLAs have been an extremely valuable element for integrated circuit designers, the current trend in processor architecture toward higher frequencies, and correspondingly shorter cycle times, has made it increasingly difficult to design large PLAs.

A typical problem in large PLA is that, for a desired cycle time, the OR plane does not have enough time to evaluate. In the worst case, all minterms may feed into one particular OR plane output line. In this case a substantial delay would be seen in producing the output if the number of minterms is large, e.g., several hundred, because the loading on the output due to junction capacitance becomes prohibitively large.

What is needed is a PLA that can accept a large number of inputs or minterms and without incurring large delays due to parasitic junction capacitance.

SUMMARY OF THE INVENTION

Briefly, a PLA structure having logic interposed between an AND plane and an OR plane, provides an additional set of minterms to the OR plane such that any PLA output function can be implemented with substantially fewer input signals. In this way, parasitic loading for implementation of any particular logic function is reduced.

In an alternative embodiment of the present invention, logic is interposed between the AND plane and source of AND plane input signals.

DETAILED DESCRIPTION

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu), or an alloy of Al and (Cu), are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

Overview

A PLA structure that reduces parasitic junction capacitance includes logic functions that combine minterms and couple the combined minterms to input terminals of a PLA OR plane. Similarly, AND plane input signals can be logically combined with additional circuitry and coupled to the AND plane input terminals. By creating more logically complex input signals, fewer transistors are required in the AND plane or OR plane. In this way, loading due to parasitic junction capacitance reduced.

Figure 2:
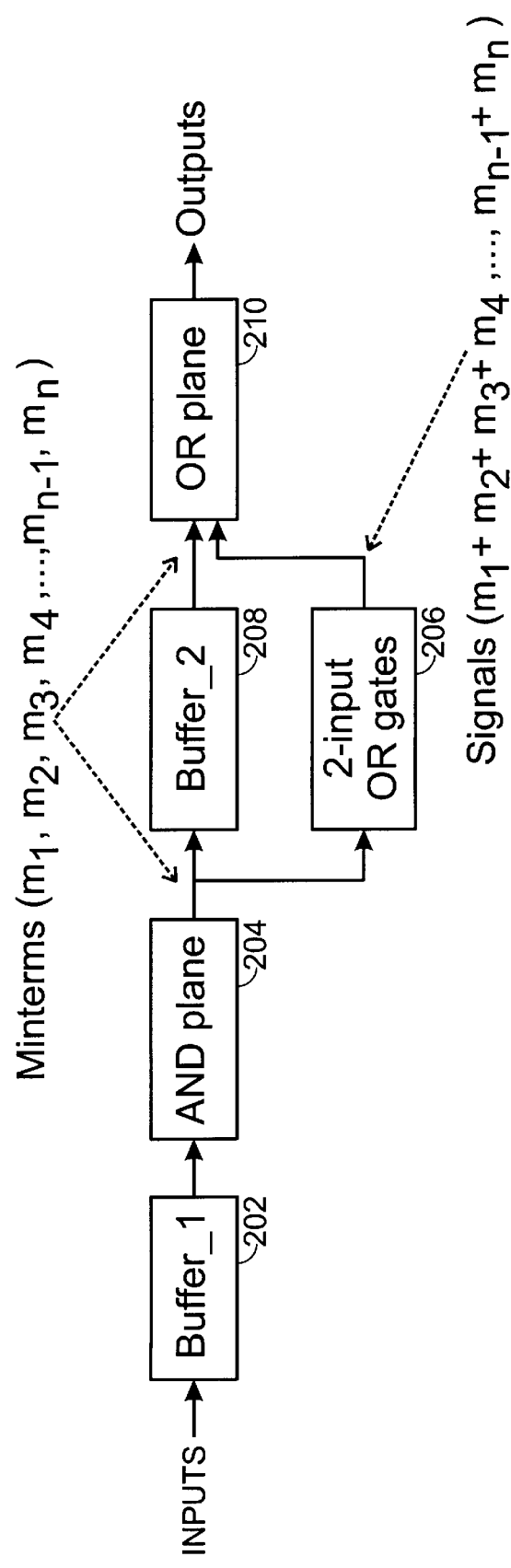
FIG. 2 is a block diagram of a PLA in accordance with one aspect of the present invention.

Referring to FIG. 2, one embodiment of a PLA in accordance with the present invention is shown.

Figure 1A:
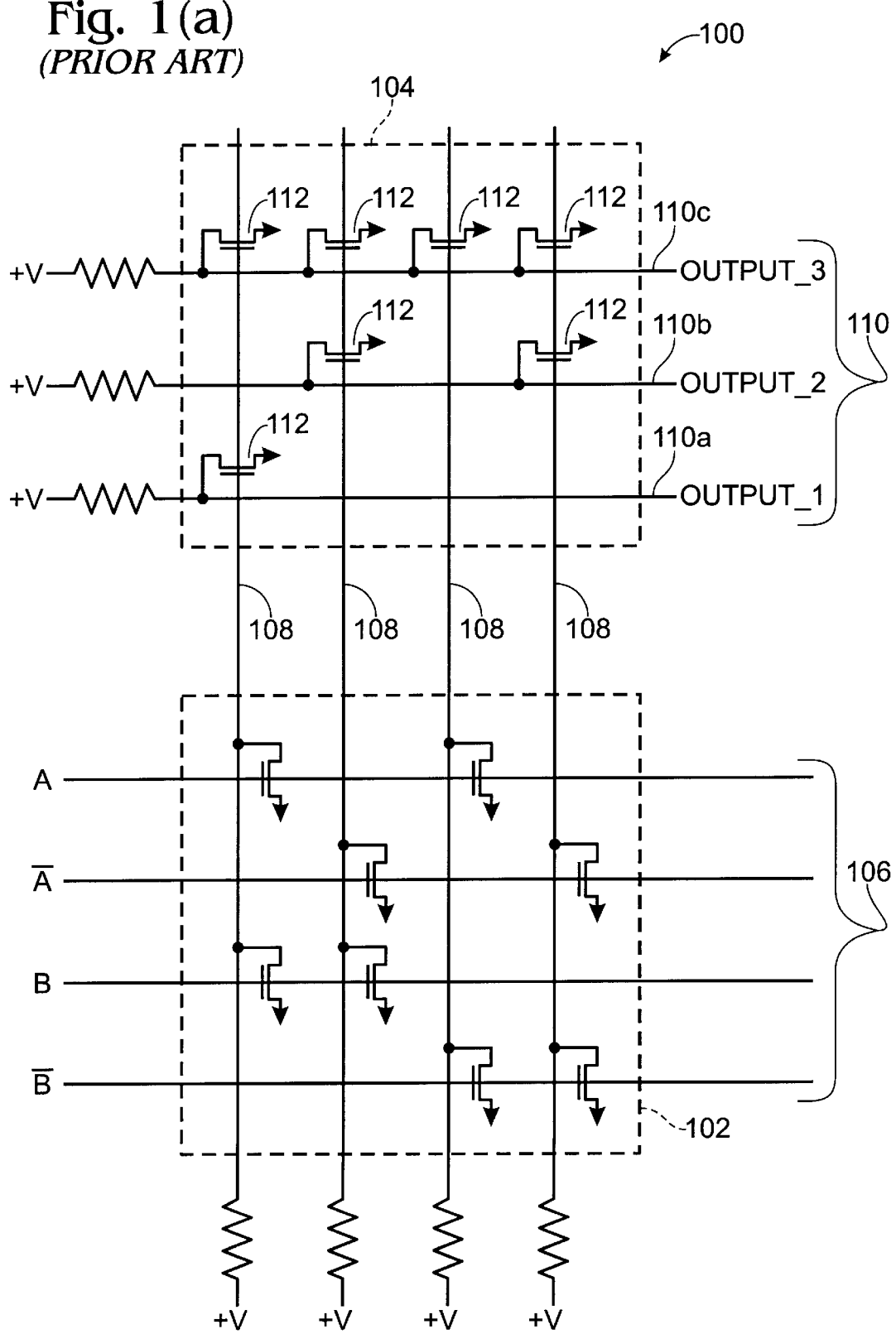
FIG. 1(a) is a transistor-level schematic of an exemplary conventional PLA.
Figure 1B:
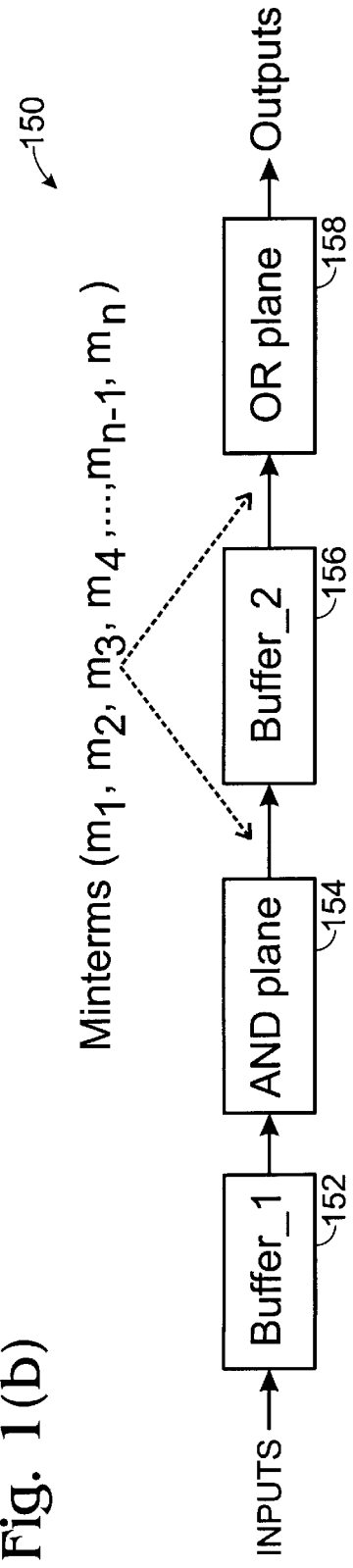
FIG. 1(b) is a block diagram a typical PLA with buffers at the input to the AND plane and the OR plane.

In operation, Buffer_2 156, as shown in FIG. 1(b), increases the signal delay without performing any logic calculation. PLAs embodying the present invention however, provide circuitry that implements logical calculations such that the results of these calculations can be used to simplify the logic of the OR plane. A simplified OR plane results in higher speed operation.

An illustrative embodiment of the present invention is shown in FIG. 2. A set of 2-input OR gates 206 is added to a PLA 200. The number of 2-input OR gates 206 in one embodiment of the present invention is equal to one half of the number of minterms. The minterms from AND plane 204 are driven not only to Buffer_2 208 as usual, but also to 2-input OR gates 206. By the time the minterms are available at the output terminals of Buffer_2 208, a new set of signals is also available at the output terminals of 2-input OR gates 206. The signals are $m_1+m_2$, $m_3+m_4$, $M_{n-1}+m_n$. Both the original minterms ($m_1$, $m_2$, $m_3$, $m_4$, , $M_{n-1}$, $m_n$) and the new set of signals are driven to OR plane 210.

For PLAs embodying the present invention, the worst case number of signals that are required to produce an OR plane output signal, when 2-input OR gates are used, is equal to (n/2)+1 where n is the number of minterms, and is an odd number greater than or equal to three. When the number of minterms is even, and 2-input OR gates are used, the worst case number of signals required to produce an OR plane output signal is half the original number of minterms required without the use of the present invention. For example, for a logic signal output_1=$(m_1+m_2)+(m_3+m_4)+$ $+(m_{n-1}+m_n)$, the number of input signals needed to create the logic signal output_1 is n/2 rather than n, because the new set of signals ($m_1+m_2$, $m_3+m_4$, $M_{n-1}+m_n$) is already available before the OR plane starts its evaluation. This allows the PLA to process a greater number of input signals, while maintaining a given timing constraint, due to the substantial reduction in parasitic junction capacitance. Alternatively, the PLA can process a given number of input signals more quickly than the time allotted by a given timing constraint, again, due to the reduction in parasitic junction capacitance.

It will be recognized by those skilled in the art having the benefit of this disclosure, that the logic gates interposed between the AND plane and the OR plane may have more than two inputs. Similarly, it will be recognized that large, high-performance PLAs typically use clocked rather than static AND plane and OR planes. Additionally, it will be recognized that the interposed logic gates may be implemented with static or dynamic logic circuits.

The area impact of incorporating the additional interconnect lines is relatively small. This is because the new set of signals ($m_1+m_2$, $m_3+m_4$, ,$m_{n-1}+m_n$) provided to the OR plane can use the space already available in the OR plane. Another area increase is attributable, however, to the set of 2-input OR gates which are used to generate $m_1+m_2$, $m_3+m_4$, ,$m_{n-1}+m_n$.

The circuit architecture of the present invention that provides reduced parasitic junction capacitance in the OR plane can also be applied to reducing parasitic junction capacitance in the AND plane.

Figure 3:
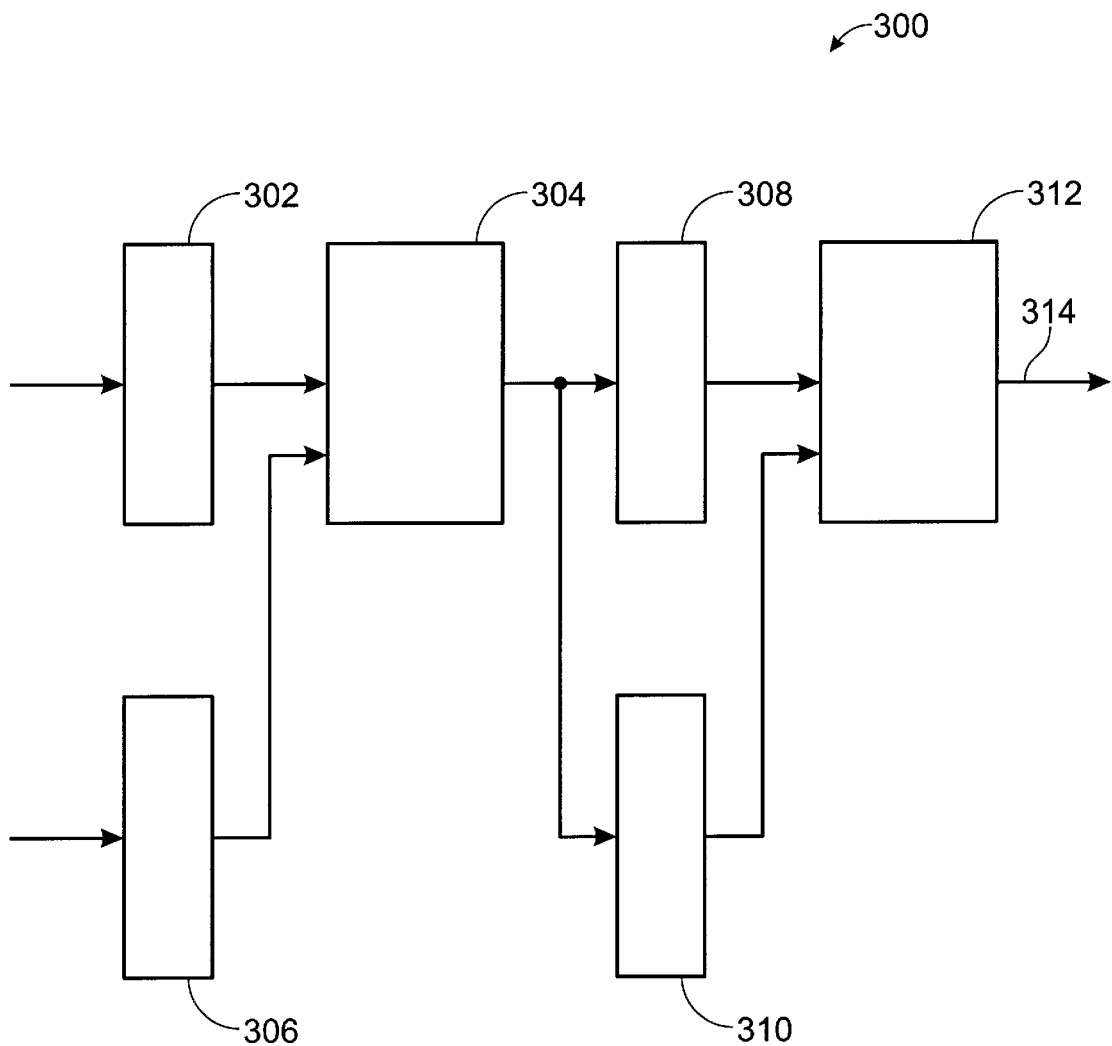
FIG. 3 is a block diagram of a PLA in accordance with a further aspect of the present invention.

Referring to FIG. 3, an alternative configuration embodying the present invention is illustrated by PLA 300 wherein the capacitive load is reduced in both the AND and the OR plane. More particularly, logic gates 306 are provided in parallel with an AND plane input signal buffer 302. The output terminals of AND plane input signal buffer 302 and the output terminals of logic gates 306 are coupled to the input terminals of AND plane 304. The output terminals of AND plane 304 are coupled to both AND plane output signal buffers 308 and to logic gates 310. The output terminals of both AND plane output signal buffers 308 and logic gates 310 are coupled to OR plane 312. The OR plane outputs are provided at 314.

In the configuration of FIG. 3, both the AND plane and the OR plane are simplified as described above in connection with FIG. 2 so as to reduce the number of transistors in AND plane 304 and OR plane 312 required to achieve a particular logical function.

It will be recognized by those of skill in the art, having the benefit of this disclosure, that the AND plane alone may be simplified without simplifying the OR plane.

Conclusion

The present invention overlaps logical operations with buffering operations such that the number of transistors in the OR plane or the AND plane of a PLA can be reduced.

An advantage of the embodiments of the present invention is that higher speed operation can be achieved because of the reduction in parasitic junction capacitance.

A further advantage of embodiments of the present invention is that a PLA can be configured with greater number of inputs or minterms and still operate within a given timing constraint because of the reduction in parasitic junction capacitance.

A still further advantage of embodiments of the present invention is that junction leakage currents are reduced because of the reduced junction area.

It will be recognized by those of skill in the art having the benefit of this disclosure that the present invention can be used to reduce the loading in regular logic structures other than PLAs. For example, address decoders for memory arrays can be modified to reduce loading in accordance with the present invention.

It will be understood that various other changes in the details, materials, and arrangements of the parts and steps which have been described and illustrated in order to explain the nature of this invention may be made by those skilled in the art without departing from the principles and scope of the invention as expressed in the subjoined Claims.

What is claimed is:

1. A circuit comprising:

an AND plane having a plurality of input terminals and a plurality of output terminals;

an OR plane having a plurality of input terminals and a plurality of output terminals; and at least one logic gate having at least two input terminals and an output terminal;

wherein the at least two input terminals of the at least one logic gate are coupled to at least two of the plurality of AND plane output terminals, the output terminal of the at least one logic gate is coupled to an input terminal of the OR plane, and the plurality of AND plane output terminals are coupled to a corresponding plurality of OR plane input terminals.

2. The circuit of claim 1, wherein the at least one logic gate implements a combinatorial logic function.

3. The circuit of claim 1, wherein the at least one logic gate implements a logical OR function.

4. The circuit of claim 1, wherein the plurality of AND plane output terminals are coupled to a corresponding plurality of OR plane input terminals through a plurality of non-inverting buffers.

5. The circuit of claim 1, further comprising a plurality of signal buffers, each signal buffer having an input terminal and an output terminal, wherein the output terminals of the plurality of signal buffers are coupled to the input terminals of the AND plane.

6. The circuit of claim 5, further comprising at least one logic gate, the logic gate having at least two input terminals and an output terminal, wherein the output terminal of the at least one logic gate is coupled to at least one output terminal of the AND plane.

7. The circuit of claim 6, wherein the at least one logic gate implements a combinatorial logic function.

8. The circuit of claim 1, wherein the at least one logic gate is a comprises a static circuit.

9. The circuit of claim 1, wherein the at least one logic gate is a comprises a dynamic circuit.

10. A programmable logic array comprising:

an AND plane having a plurality of input terminals and a plurality of output terminals;

a plurality of buffers each having an input terminal and an output terminal; each input terminal coupled to an output terminal of the AND plane;

an OR plane having a plurality of input terminals and a plurality of output terminals, a portion of the plurality of the OR plane input terminals coupled to the outputs of the buffers;

a first plurality of logic gates each having at least two input terminals and an output terminal;

wherein the at least two input terminals of the first plurality of logic gates are coupled to a plurality of AND plane output terminals, the output terminals of the at least one logic gate being coupled to an input of the OR plane, and the plurality of AND plane output terminals are coupled to a corresponding plurality of OR plane input terminals.

11. The programmable logic array of claim 10, wherein the buffers are non-inverting buffers.

12. The programmable logic array of claim 10, wherein the first plurality of logic gates are combinational logic gates.

13. The programmable logic array of claim 10, wherein the first plurality of logic gates are logical OR gates.

14. The programmable logic array of claim 10, wherein the there is one of the first plurality of logic gates for every two AND plane output terminals.

15. The programmable logic array of claim 10, further comprising a second plurality of logic gates coupled to a portion of the plurality of AND plane input terminals.

16. The programmable logic array of claim 10, wherein the second plurality of logic gates are combinational logic gates.

17. The programmable logic array of claim 10, wherein the second plurality of logic gates are logical OR gates.

* * * * *